US006801052B2

(12) United States Patent
Pugh et al.

(10) Patent No.: US 6,801,052 B2
(45) Date of Patent: Oct. 5, 2004

(54) FIELD PROGRAMMABLE GATE ARRAY CORE CELL WITH EFFICIENT LOGIC PACKING

(75) Inventors: Daniel J. Pugh, San Jose, CA (US); Andrew W. Fox, Pacific Grove, CA (US); Dale Wong, San Francisco, CA (US)

(73) Assignee: Leopard Logic, Inc., Cupertino, CA (US)

( * ) Notice: Subject to any disclaimer, the term of this patent is extended or adjusted under 35 U.S.C. 154(b) by 0 days.

(21) Appl. No.: 10/269,830

(22) Filed: Oct. 11, 2002

(65) Prior Publication Data

US 2003/0085733 A1 May 8, 2003

Related U.S. Application Data

(60) Provisional application No. 60/329,892, filed on Oct. 16, 2001.

(51) Int. Cl.[7] .............................................. H01L 25/00
(52) U.S. Cl. .............................. 326/39; 326/38; 326/41; 326/46
(58) Field of Search ................................ 326/38–41, 46

(56) References Cited

U.S. PATENT DOCUMENTS

| 5,600,264 | A | | 2/1997 | Duong et al. .................. 326/39 |
|---|---|---|---|---|
| 5,610,829 | A | | 3/1997 | Trimberger .................. 364/489 |
| 5,905,385 | A | | 5/1999 | Sharpe-Geisler ............. 326/39 |
| 6,124,731 | A | * | 9/2000 | Young et al. ................. 326/41 |
| 6,363,519 | B1 | | 3/2002 | Levi et al. ..................... 716/16 |
| 6,400,180 | B2 | * | 6/2002 | Wittig et al. .................. 326/41 |
| 6,421,817 | B1 | | 7/2002 | Mohan et al. ................ 716/16 |

OTHER PUBLICATIONS

J. Cong & Y. Ding "FlowMap: An Optimal Technology Mapping Algorithm for Delay Optimization in Lookup–Table Based FPGA Designs," IEEE Transactions on Computer–Aided Design of Integrated Circuits and Systems, Vo. 13, No. 1, Jan. 1994.

* cited by examiner

Primary Examiner—Anh Q. Tran
(74) Attorney, Agent, or Firm—Ritter, Lang & Kaplan LLP

(57) ABSTRACT

A Field Programmable Gate Array (FPGA) core cell with one or more Look-Up Tables (LUTs) and a selectable logic gate is presented as a space-efficient alternative to the conventional LUT-based FPGA core cell. An algorithm based upon the familiar FlowMap algorithm for LUT-based FPGA core cells implements the mapping of a Boolean logic network into the disclosed FPGA core cell.

14 Claims, 3 Drawing Sheets

FIELD PROGRAMMABLE GATE ARRAY CORE CELL WITH EFFICIENT LOGIC PACKING

CROSS-REFERENCES TO RELATED APPLICATIONS

This patent application claims priority from U.S. Provisional Patent Application No. 60/329,892, filed Oct. 16, 2001, and which is incorporated herein for all purposes.

BACKGROUND OF THE INVENTION

The present invention is related to the design of FPGA (Field Programmable Gate Array) core cell designs and, in particular, to core cells based upon LUTs (Look-Up Tables).

FPGAs are integrated circuits whose functions are defined by the users of the FPGA. With shrinking geometries in semiconductor technology, FPGA cores, the main portion of FPGAs after the peripheral circuits have been removed, are also embedded with other defined elements or circuit blocks in ASICs (Application Specific Integrated Circuits). The user programs the FPGA or FPGA core (hence the term, "field programmable") to perform the functions desired by the user. (Henceforth, the term, FPGA, is used to include both the discrete FPGA device and the FPGA core unless a distinction is specifically made.) The FPGAs have an interconnection network between the logic cells or blocks, and the interconnection network and the logic cells are configurable to perform the application desired by the user. For FPGAs based on SRAM (Static Random Access Memory) cells to hold the configuration bits, the configuration of the FPGA can be repeatedly changed by the user for multiple applications of the electronic system. For FPGAs based on manufacturing mask programming (for example, a via mask), the configuration of the FPGA is performed only once.

In most cases, the logic cells of an FPGA are implemented in the form of a look-up table, rather than an assemblage of programmable logic gates. A look-up table (LUT) with x number of inputs can implement any Boolean logic function of x variables and there are algorithms which can map a given Boolean logic network into a network of LUTs with a minimum delay through the network.

The present invention is directed toward improving the packing of the LUT-based FPGA logic cells so that the FPGA occupies less space for the same degree of functionality. The resulting manufacturing yields of the integrated circuit, either FPGA or ASIC, is increased and costs are lowered. In addition, reducing the number of LUTs required for a given functionality generally increases the speed of the implemented function.

SUMMARY OF THE INVENTION

To achieve these ends, the present invention provides for an integrated circuit having an FPGA core with core cells. Each FPGA core cell comprises a plurality of core cell input terminals and a plurality of core cell output terminals; one or more LUTs, each LUT having an output terminal and a plurality of input terminals, each input terminal of each LUT connected to one of the core cell input terminals; a selectable logic gate having an output terminal and a plurality of input terminals, each input terminal connected to one of said LUT output terminals or to any remaining core cell input terminal not connected to an LUT input terminal; and circuitry selectably connecting the output terminals of the LUTs and the selectable logic gate to the core cell output terminals.

The core cell is programmed by setting memory cells or vias in the one or more LUTs, selecting the logic gate and selectably connecting the output terminals of the one or more LUTs and of the selectable logic gate to the core cell output terminals.

To program the core cells for mapping a given Boolean network into the FPGA core, the present invention also provides for the steps of partitioning the logic network into a plurality of cuts, each partitioning cut having no more than the number of core cell input terminals and mapping into logic of the partitioned cut; generating a network graph of each partitioning cut; partitioning input terminals of each partitioning cut into input sets corresponding to input terminals of the LUTs of the core cell in different combinations; generating a network graph for each input partitioning cut for all input combinations; determining equivalence between the network graphs of each partitioning cut, and logic combinations of the partitioning cuts for different logic; and finding an equivalence match for a mapping for logic of each partitioning cut into a logic cell core configured for matching input combination and selected logic gate.

DESCRIPTION OF THE SPECIFIC EMBODIMENTS

FPGAs can have many different architectures. See; for example, U.S. application Ser. No. 10/202,397, entitled "Hierarchical Multiplexer-Based Integrated Circuit Interconnect Architecture For Scalability and Automatic Generation," filed Jul. 24, 2002, and assigned to the present assignee. These architectures all define and arrange logic function blocks and interconnections between the logic function blocks. Programming of the FPGA involves setting the functions of the blocks and the interconnections between the blocks by configuration bits. Typically the architecture is created by a basic unit, an FPGA core cell with surrounding interconnection cells, which is repeated in two directions to create the FPGA array. The FPGA core cell, either singly or collectively with other core cells, functions as a logic function block.

As described above, most FPGA architectures use LUTs for the logic function block. However, a logic network mapping onto LUTs alone is not necessarily the most efficient implementation of the logic network. It is frequently the case that a LUT may only be sparsely populated, i.e., only a few of the memory addresses of the LUT are needed to implement the mapped logic function, and a specific restructuring of the logic yields a more efficient implementation. For example, the logic function F=(abcd+efgh) has 8 variables and could be mapped to an 8-input LUT, which requires a memory space of $2^8$=256 bits to implement. Alternatively, the same function could be mapped to three 4 input LUTs (each 4-input LUT having 16 ($2^4$) bits), which requires a memory of 3*16=48 bits to implement. Finally, if a dedicated OR gate were available, the same function could be mapped to one OR gate plus a memory of 2*16=32 bits. In another example, the logic function G=a(b+c+d+e) has 5 variables and could be mapped to a 5 input LUT, which require a memory of $2^5=32$ memory bits. Alternatively, if a dedicated AND gate were available, the same function could be mapped to one AND gate plus a memory of only $2^4=16$ bits.

The present invention optimizes LUT-based core cells with a more efficient implementation of a logic network in an FPGA. After a logic network has been mapped into a given LUT-based FPGA core, a more efficiently packed LUT and logic gate-based FPGA core is used to implement the logic network.

Figure 1A:
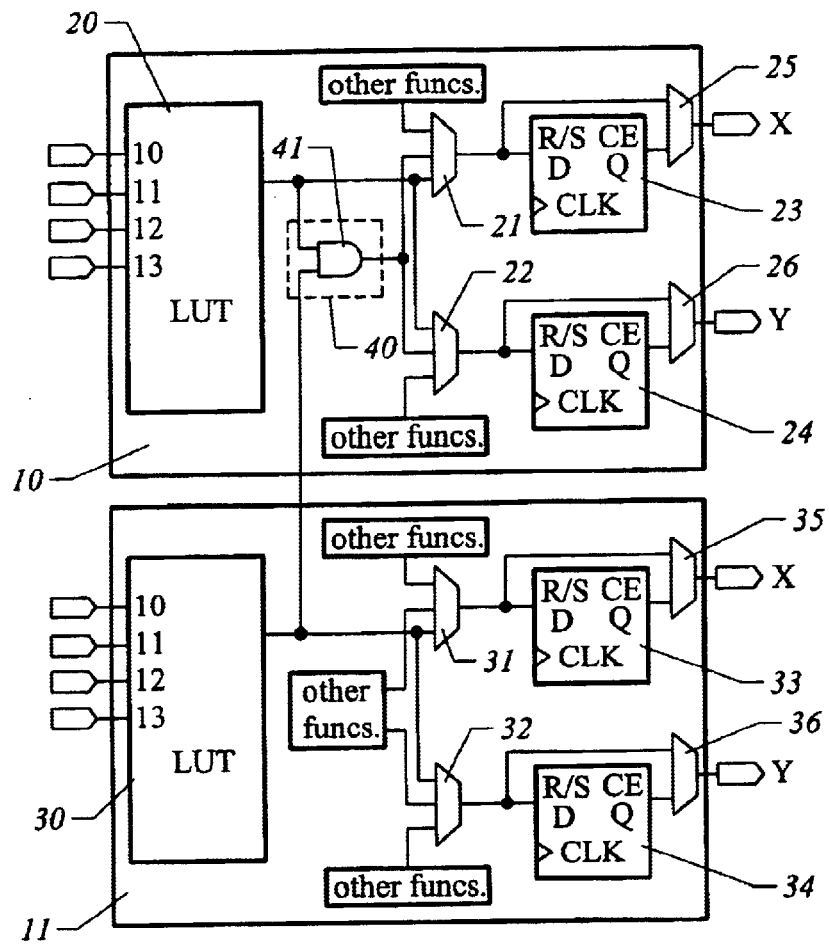
FIG. 1A is an example of an FPGA core cell according to one embodiment of the present invention.

FIG. 1A is a block diagram of an exemplary FPGA core cell according to one embodiment of the present invention. The core cell has two parts 10 and 11, each part having a LUT, multiplexers and clocked latches with output terminals X and Y. The output of each of the LUTs is connected to the input terminals of a selected logic gate which has its output terminal coupled to the output terminals of part 10. The selected logic gate, as described in greater detail below, helps avoid large-sized LUTs and makes the core cell more space-efficient, in accordance with present invention.

Part 10 has a 4-input LUT 20 with its output terminal connected in parallel to input terminals of multiplexers 21 and 22, and one input terminal of an AND gate 41, which is described in greater detail below. In passing, it should be noted that control lines to the multiplexers in FIG. 1A (and following drawings) are not shown. It is understood that control signals which govern the selective operation of the multiplexers are set by the configuration bits of the FPGA. Besides an input terminal connected to the output terminal of the LUT 20, the multiplexer 21 has a second input terminal connected to an output terminal of the AND gate 41 and a third input terminal connected to other logic function circuit. The other logic functions are circuits that implement additional functionality not relevant to the present invention, such as carry logic, 5-input LUTs, and 6-input LUTs, etc. The output terminal of the multiplexer 21 is connected to an input terminal of a clocked latch 23 which has its output terminal connected to one input terminal of a multiplexer 25. A second input terminal of the multiplexer 25 is connected directly to the output terminal of the multiplexer 21 so that the multiplexer 25 can select a clocked output or direct output from the multiplexer 21. The output terminal of the multiplexer 25 provides the X output for the part 10.

In a similar fashion, the multiplexer 22 has a second input terminal connected to the output terminal of the AND logic gate 41 and a third input terminal connected to another logic function circuit. The output terminal of the multiplexer 22 is connected to an input terminal of a clocked latch 24 which has its output terminal connected to one input terminal of a multiplexer 26. A second input terminal of the multiplexer 26 is connected directly to the output terminal of the multiplexer 22 so that the multiplexer 26 can select a clocked output or direct output from the multiplexer 22. The output terminal of the multiplexer 26 provides an "Y" output for the part 10.

The second part 11 of the core cell has a similar, but not exact, circuit arrangement as that of part 10. A 4-input LUT 30 has its output terminal connected to input terminals of multiplexers 31 and 32, and a second input terminal of the AND logic gate 41. A second and third input terminals of the multiplexer 31 are connected to two other logic function circuits. The other functions circuits are similar to those connected to multiplexers 21 and 22. The output terminal of the multiplexer 31 is connected to an input terminal of a clocked latch 33 which has its output terminal connected to one input terminal of a multiplexer 35 which has a second input terminal connected directly to the output terminal of the multiplexer 31. The multiplexer 35 can select a clocked or direct output from the multiplexer 31 and provides an "X" output for the part 11.

With respect to the multiplexer 32, a second input terminal is connected to the same logic function circuit as the second input terminal of the multiplexer 31, and a third input terminal is connected to still another logic function circuit. Likewise, the output terminal of the multiplexer 32 is connected to an input terminal of a clocked latch 34 which has its output terminal connected to one input terminal of a multiplexer 36 which has a second input terminal connected directly to the output terminal of the multiplexer 32. The output terminal of the multiplexer 35 provides an "Y" output for the part 11.

Figure 1B:
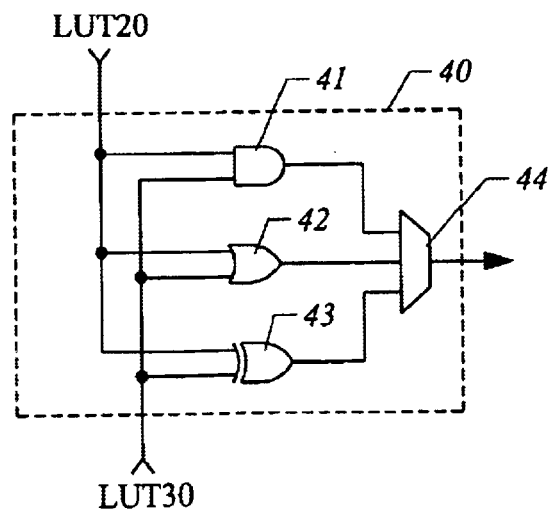
FIG. 1B is a detail of a portion of the FIG. 1A core cell.

The AND gate 41 is shown with a dotted line 40 around it to indicate that the logic gate is one of a plurality of logic gates which may be selected to make the connections illustrated in FIG. 1A. FIG. 1B shows that in this embodiment of the present invention; a dedicated AND gate 41, OR gate 42, and XOR gate 43 may be selected by a multiplexer 44 to make the connections of FIG. 1A. Hence while the AND logic gate 41 is shown in FIG. 1A, the OR gate 42 and XOR gate 43 are simultaneously present; but at most one of the dedicated gates 41–43 may be used at the same time. The output of these dedicated gates 41–43 may be configured to be the output of the overall core cell. Such a core cell can support, for example, functions with up to 8 inputs, or two different functions of 4 inputs and 3 inputs.

As mentioned above, the operation of the multiplexers in the FPGA core cell is set by the configuration bits for the FGPA. Hence the selection of a particular logic gate 41–43 by the multiplexer 44 is governed by configuration bits also. The configuration bits are set by an algorithm which maps the FPGA user's desired logic network into the FPGA core.

Figure 2:
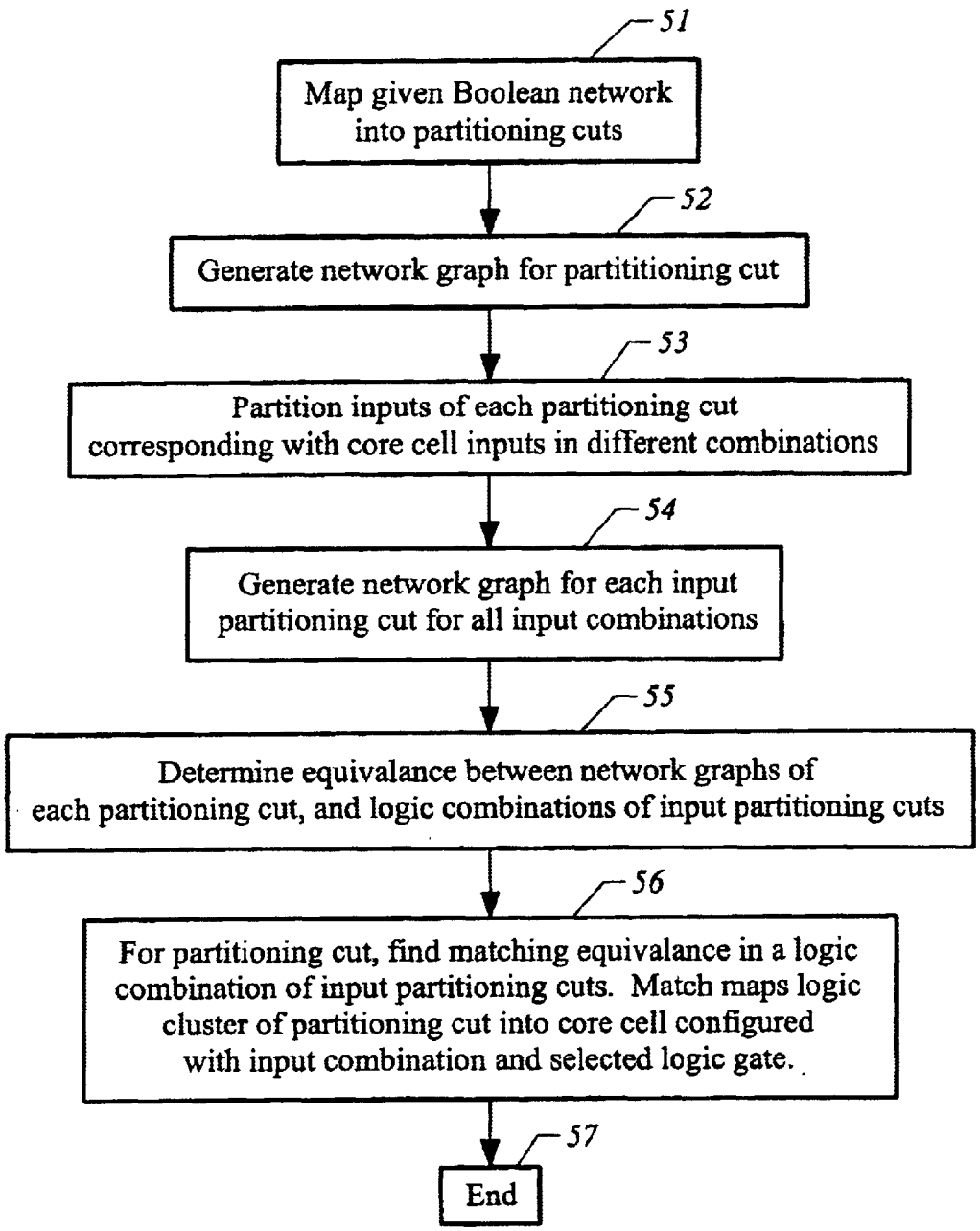
FIG. 2 is a flow chart of a logic mapping algorithm for the FIG. 1A core cell, according to the present invention.

A particular logic mapping algorithm for the FPGA core cell of FIGS. 1A and 1B is illustrated by a flow chart in FIG. 2. The mapping algorithm of the present invention starts with the results of the FlowMap algorithm, or other similar algorithms which finds K-bounded, i.e., in this case, K=8 inputs or less, logic clusters called partitioning cuts that can be efficiently mapped into 8-input LUTs. The 8-input LUTs are the presumed basic programmable logic blocks of the FPGA. See the paper by J. Cong and Y. Ding, "FlowMap: An Optimal Technology Mapping Algorithm for Delay Optimization in Lookup-Table Based FPGA Designs," *IEEE Trans. Computer-aided Design*, vol. 13 (1), January 1994, pp. 1–13, for details. Such algorithms are familiar to designers of LUT-based FPGAs. An exemplary network and its partition is illustrated in FIG. 3.

For each partitioning cut, a Binary Decision Diagram (BDD) is generated using up to 8 BDD variables by step 52 in the flow chart of FIG. 2. The BDDs, which are network graphs or representative software constructs of the logic of the partitioning cuts, are well known to circuit designers and are referred to as "bdd_cut" in the steps below.

Figure 3:
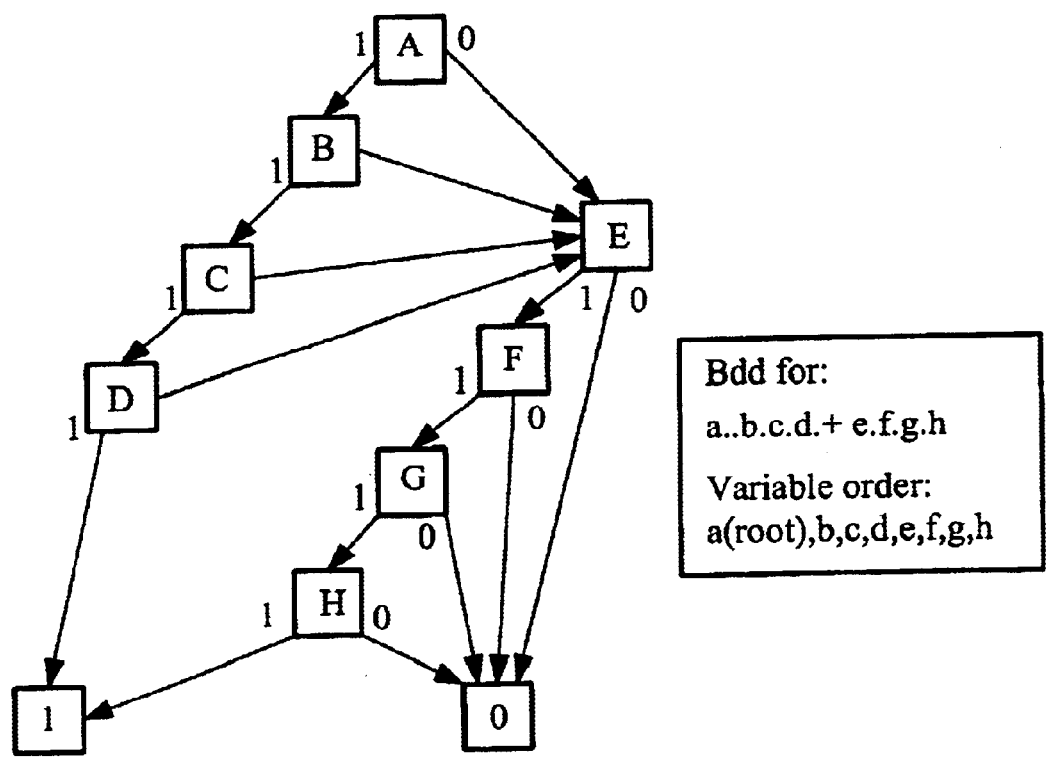
FIG. 3 illustrates a Binary Decision Diagram used in the logic mapping algorithm for an exemplary partitioning cut.

FIG. 3 shows an exemplary BDD for a partitioning cut for the logic function F=(abcd+efgh) which has 8 variables and could be mapped to an 8-input LUT. The diagram as a whole is a single BDD (Binary Decision Diagram). The two boxes at the bottom of the drawings, 1 and 0, represent logical TRUE and FALSE, respectively, and are always present for any BDD. The other boxes in the BDD represent the variables in the logic expression, one box for each variable (in this example, one box each for the variables a, b, c, d, e, f, g, and h). Each variable box has two paths leading down from it, one path for 1 and the other path for 0, representing the two cases where the given variable is either TRUE or FALSE, respectively. By following a path from the root (top) of the BDD to the bottom (the 0 and 1 boxes), by taking either the 0 or 1 paths from each variable box depending whether the variable is TRUE or FALSE, the bottom of the BDD is reached at either the 0 or 1 box which is the overall result of the overall function.

With respect to the present invention, it should be noted that for a given variable ordering, the BDD is unique and can be used to compare logical equivalency between two logical functions. The functions are logically equivalent if and only if their BDDs are the same.

Returning to FIG. 2, by step 53 the inputs of each cut are partitioned into 2 sets, Set1 and Set2, each set having a number of inputs that does not exceed the number of inputs of the core cell LUTs. These input sets match the input sets of the subject core cell, i.e., the exemplary core cell of FIG. 1A which has two sets of 4 inputs, each set to one of the two LUTs 20 and 30. The input partitions may be generated by various methods to generate different combinations of inputs for the partitioning cut. One method well known to designers of LUT FPGAs is to use a rectangular covering method, a method based on the familiar Karnough mapping. A Boolean matrix is first generated and the best two rectangle covering matrices are chosen. Columns of rectangles determine cut partitions used. Another way is to use an enumeration method (which is computationally easy for cuts of size 8). All combinations of two partitions of up to 4 variables exhaustively enumerated. For example, with 8 input variables, the number of possible partitions equals the number of ways to choose 4 elements from a set of 8 elements, divided by 2 to remove symmetrical duplicates, which equals 35 distinct partitions.

In step 54, for each input partition cut set (Set1,Set2), the BDD for Set1 (referred to as "bdd_1") and BDD for Set2 (referred to as "bdd_2") are determined, and in step 55, a test for equivalence is performed between bdd_cut and each of following logic reductions on bdd_1 and bdd_2:

and(bdd_,bdd_2)
nand(bdd_1,bdd_2)
or(bdd_1 bdd_2)
nor(bdd_1,bdd_2)
xor(bdd_1,bdd_2)
xnor(bdd_1,bdd_2)

This tests the appropriateness of the different logic gates within the dotted line 40 in FIGS. 1A and 1B. Furthermore, for each case, the inverted/true phase of each input cut partition is also tested. For example, the combinations for and(inverted(bdd_1),bdd_2),
and(inverted(bdd_1), inverted(bdd_2)),
and(bdd_1,inverted(bdd_2)), and so forth.

are tested. To realize inversions in the FPGA core cell, the inversions of the input signals, e.g., inverted(bdd_1), and of the logic gates, e.g., nor, are made by appropriate settings within the LUTs.

When a match is found by step 56, the matching operator (one of XOR, OR, AND), input partition (Set1,Set2), and any partition inversions are returned. This is the logic gate to be selected and the LUT specification for the particular partitioning cut. The FPGA core cell is configured accordingly. This algorithm can be sequentially applied with each step 51–56 operative on all of the partitioning cuts with logic clusters before moving to the next step, or iteratively applied with each step 51–56 operative on one partitioning cut and moving to the next step and repeating steps 51–56 until all the partitioning cuts of the logic network are mapped. End step 57 terminates the steps of the algorithm.

The present invention can be generalized beyond the particular logic cell of FIGS. 1A and 1B and the corresponding algorithm. The exemplary FPGA logic core cell in FIG. 1A has 8 inputs separated into a first set of 4 inputs into the LUT 20 and another set of 4 inputs into the LUT 30. The present invention can be generalized so that the number of inputs need not be 8, as long as the input number is equal to input number bound ("K" in the Cong and Ding paper) for the FlowMap or equivalent. The input number need not be partitioned equally, nor even into two sets. Of course, with changes to the FPGA core cell, the mapping algorithm must be changed accordingly. However, it is felt that most logic networks can best be mapped into an FPGA having core cells with 8 inputs which are split equally as illustrated in FIG. 1A.

Hence the FPGA core cell of the present invention allows logic networks which have been mapped into LUT-based FPGAs to be packed more efficiently.

While the foregoing is a complete description of the embodiments of the invention, it should be evident that various modifications, alternatives and equivalents may be made and used. Accordingly, the above description should not be taken as limiting the scope of the invention which is defined by the metes and bounds of the appended claims.

What is claimed is:

1. In an integrated circuit having an FPGA core with core cells, each FPGA core cell comprising
    a plurality of core cell input terminals and one or more core cell output terminals;
    one or more LUTs, each LUT having an output terminal and a plurality of input terminals, each input terminal of each LUT connected to one of said core cell input terminals;
    a selectable logic gate having an output terminal and a plurality of input terminals, each input terminal connected to one of said LUT output terminals or to any remaining core cell input terminal not connected to an LUT input terminal; and
    circuitry selectably connecting said output terminals of said LUTs and said selectable logic gate to said core cell output terminals;
    whereby said core cell is programmed by setting configuration bits in said one or more LUTs, selecting said logic gate and selectably connecting said output terminals of said one or more LUTs and of said selectable logic gate to said core cell output terminals.

2. The integrated circuit of claim 1 wherein said one or more LUTs comprise a plurality of LUTs, each LUT having an equal number of input terminals.

3. The integrated circuit of claim 2 wherein each LUT has four input terminals.

4. The integrated circuit of claim 3 wherein each FPGA core cell comprises eight input terminals.

5. The integrated circuit of claim 1 wherein said selectably connecting circuitry comprises clocked latches and multiplexers for clocked and unclocked signals through said core cell output terminals.

6. In an integrated circuit having an FPGA core with core cells, each FPGA core cell comprising
    a plurality of core cell input terminals and one or more core cell output terminals;
    a pair of LUTs, each LUT having an output terminal and four input terminals, each input terminal of each LUT connected to one of said core cell input terminals;

a selectable logic gate having an output terminal and a plurality of input terminals, each input terminal connected to one of said LUT output terminals or to any remaining core cell input terminal not connected to an LUT input terminal, said selectable logic gate selected from a group of logic gates, said group comprising AND, OR and XOR logic gates; and circuitry selectably connecting said output terminals of said LUTs and said selectable logic gate to said core cell output terminals;

whereby said core cell is programmed by setting configuration bits in said one or more LUTs, selecting said logic gate and selectably connecting said output terminals of said pair of LUTs and of said selectable logic gate to said core cell output terminals.

7. In an integrated circuit having an FPGA core with core cells, each FPGA core cell comprising a plurality of core cell input terminals and one or more core cell output terminals;

one or more LUTs, each LUT having an output terminal and a plurality of input terminals, each input terminal of each LUT connected to one of said core cell input terminals;

a selectable logic gate having an output terminal and a plurality of input terminals, each input terminal connected to one of said LUT output terminals or to any remaining core cell input terminal not connected to an LUT input terminal, said selectable logic gate selected from a group of logic gates, said group comprising AND, OR and XOR logic gates; and circuitiy selectably connecting said output terminals of said LUTs and said selectable logic gate to said core cell output terminals;

whereby said core cell is programmed by setting configuration bits in said one or more LUTs, selecting said logic gate and selectably connecting said output terminals of said one or more LUTs and of said selectable logic gate to said core cell output terminals.

8. In an integrated circuit having an FPGA core with core cells, each FPGA core cell comprising a plurality of core cell input terminals and one or more core cell output terminals;

a plurality of LUTs, each LUT having an output terminal and a plurality of input terminals, each input terminal of each LUT connected to one of said core cell input terminals;

a selectable logic gate having an output terminal and a plurality of input terminals, each input terminal connected to an output terminal of each of said LUTs or to any remaining core cell input terminal not connected to an LUT input terminal; and circuitry selectably connecting said output terminals of said LUTs and said selectable logic gate to said core cell output terminals;

whereby said core cell is programmed by setting configuration bits in said one or more LUTs, selecting said logic gate and selectably connecting said output terminals of said plurality of LUTs and of said selectable logic gate to said core cell output terminals.

9. The integrated circuit of claim 8 wherein each LUT has an equal number of input terminals.

10. The integrated circuit of claim 9 wherein each LUT has four input terminals.

11. The integrated circuit of claim 10 wherein each FPGA core cell comprises eight input terminals.

12. The integrated circuit of claim 11 wherein said selectable logic gate is selected from a group of logic gates, said group comprising AND, OR and XOR logic gates.

13. The integrated circuit of claim 8 wherein said selectable logic gate is selected from a group of logic gates, said group comprising AND, OR and XOR logic gates.

14. The integrated circuit of claim 8 wherein said selectably connecting circuitry comprises clocked latches and multiplexers for clocked and unclocked signals through said core cell output terminals.

* * * * *